(12) United States Patent
Kawakami et al.

(10) Patent No.: US 8,314,540 B2
(45) Date of Patent: Nov. 20, 2012

(54) COLOR CONVERTED LIGHT EMITTING APPARATUS

(75) Inventors: Yasuyuki Kawakami, Tokyo (JP); Tsutomu Akagi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 372 days.

(21) Appl. No.: 12/617,386

(22) Filed: Nov. 12, 2009

(65) Prior Publication Data

US 2010/0117511 A1    May 13, 2010

(30) Foreign Application Priority Data

Nov. 13, 2008    (JP) .................................. 2008-291152

(51) Int. Cl.
*H01J 1/62*    (2006.01)
(52) U.S. Cl. ........................................................ 313/483
(58) Field of Classification Search .................. 313/483, 313/486
See application file for complete search history.

(56) References Cited

U.S. PATENT DOCUMENTS

| 2004/0094757 | A1 | 5/2004 | Braune et al. | |
| 2007/0046169 | A1* | 3/2007 | Maeda et al. | ................ 313/487 |
| 2009/0008673 | A1 | 1/2009 | Kato et al. | |

FOREIGN PATENT DOCUMENTS

| JP | 2005-109434 A | 4/2005 |
| JP | 2005-524737 A | 8/2005 |
| JP | 2007-19459 A | 1/2007 |

* cited by examiner

*Primary Examiner* — Anh Mai
*Assistant Examiner* — Brenitra M Lee
(74) *Attorney, Agent, or Firm* — Kenealy Vaidya LLP (57) ABSTRACT

A color converted light emitting apparatus is provided that has excellent light emission characteristics and can be manufactured while a viscosity suitable for a printing method is maintained. The color converted light emitting apparatus can include a light emitting element and a color conversion layer containing a phosphor that is excited by light emitted from the light emitting element and which emits fluorescent light. The color conversion layer can further contain, as first and second thickeners, two types of particles with different average primary particle diameters. The average primary particle diameter of the second thickener can be less than one half of the average primary particle diameter of the first thickener. By appropriately adjusting the average primary particle diameters and the amounts of the thickeners added, the light emission characteristics and the emission chromaticity can be improved. For example, the first thickener can be adjusted to be present in the amount of at least 30 wt % and less than 100 wt % based on a total weight of the first and second thickeners.

20 Claims, 9 Drawing Sheets

COLOR CONVERTED LIGHT EMITTING APPARATUS

This application claims the priority benefit under 35 U.S.C. §119 of Japanese Patent Application No. 2008-291152 filed on Nov. 13, 2008, which is hereby incorporated in its entirety by reference.

TECHNICAL FIELD

The presently disclosed subject matter relates to a color converted light emitting apparatus. In particular, the presently disclosed subject matter relates to a color converted light emitting apparatus including a color conversion layer that is formed by printing so as to cover an LED chip.

BACKGROUND ART

In one example of known light emitting apparatuses that use an LED chip, a resin layer (color conversion layer) containing phosphor particles is disposed around the LED chip. The phosphor in the color conversion layer is excited by absorbing part of the light emitted from the LED chip and emits fluorescent light. For example, the light emitting apparatus as disclosed in Japanese Patent Application Laid-Open No. 2005-109434 can be configured to include an LED chip that can emit blue light, and a phosphor that can emit yellowish orange fluorescent light that is complementary to the blue light. This light emitting apparatus can emit white light resulting from the mixture of the blue light from the LED chip with the yellowish orange fluorescent light from the phosphor.

To form the color conversion layer using a resin containing phosphor particles, a paste prepared by adding the phosphor particles to a resin material can be applied in drop form onto the LED chip, or a printing method such as stencil printing or screen printing can be used. Therefore, it is desirable to adjust the viscosity of the paste according to the method of forming that is used.

Japanese Translation of PCT International Application No. 2005-524737 discloses a light emitting diode element including a color conversion layer to which a thickener partly composed of nanoparticles is added. In this publication, the disclosed particle diameter of the thickener is 1 nm or more and 25 nm or less.

Japanese Patent Application Laid-Open No. 2007-19459 describes that optical properties and workability can be improved by adding inorganic oxide particles to a color conversion member containing a phosphor. For example, silica particles having a diameter of approximately 10 nm can exhibit a strong viscosity adjusting effect, and silica particles having a diameter of several μm can impart little thixotropy but exhibit the effect of suppressing cracks and shrinkage. Moreover, the addition of inorganic oxide particles having a diameter of approximately 1 μm can improve a scattering effect, and the addition of high-refractive index particles having a diameter of 3 to 5 nm can increase the refractive index. These particles may be used in combination.

SUMMARY

In order to form a color conversion layer having a predetermined shape around a semiconductor chip, such as an LED chip, using a printing method, the viscosity of the paste is typically increased by, for example, adding a thixotropic material (for example, a thickener) having an average diameter of 1 μm or less. In the process of the printing method, the target shape of the phosphor layer can be maintained while the resin used in the paste is not thermally cured. Therefore, the thickener can be added in an amount of generally about 10 wt % or more.

However, when a large amount of thickener is added, the transparency of the color conversion layer decreases, and this undesirably causes a reduction in light emission efficiency.

The presently disclosed subject matter was devised in view of these and other characteristics, features and problems and in association with the conventional art. According to an aspect of the presently disclosed subject matter, a light emitting apparatus can be provided that has excellent light emission characteristics and can be manufactured while a viscosity of a coating suitable for a printing method is maintained.

According to another aspect of the presently disclosed subject matter, a color converted light emitting apparatus can include: a light emitting element; and a color conversion layer containing a phosphor that is excited by light emitted from the light emitting element and emits fluorescent light, wherein the color conversion layer further contains, as first and second thickeners, two types of particles with different average primary particle diameters. When the larger one is referred to as the first thickener and the smaller one is referred to as the second thickener, the average primary particle diameter of the second thickener is less than one half of the average primary particle diameter of the first thickener. By appropriately adjusting the average primary particle diameters and the amounts of the thickeners added, the light emission characteristics can be improved.

A difference in average primary particle diameter between the first and second thickeners can be greater than 20 nm.

The first thickener can have an average primary particle diameter of approximately 40 nm.

The second thickener can have an average primary particle diameter of 7 nm or more and less than 20 nm. For example, the second thickener can have an average primary particle diameter of approximately 7 nm or approximately 16 nm.

The first thickener can be present in an amount of 30 wt % or more and less than 100 wt % based on a total weight of the first and second thickeners.

The second thickener may have an average primary particle diameter of approximately 16 nm. In this case, the first thickener can be present in an amount of 60 wt % or more and 95 wt % or less based on the total weight of the first and second thickeners. In this range, the light emission efficiency can be improved.

The second thickener may have an average primary particle diameter of approximately 7 nm. In this case, the first thickener can be present in an amount of 90 wt % or more and less than 100 wt % based on the total weight of the first and second thickeners. In this range, the light emission efficiency can be improved.

The second thickener may have an average primary particle diameter of approximately 7 nm or approximately 16 nm. In this case, the first thickener can be present in an amount of 70 wt % or more and 90 wt % or less based on the total weight of the first and second thickeners. In this range, the chromaticity of the emitted light can be improved.

According to several aspects of the presently disclosed subject matter, by appropriately setting the average primary particle diameters and concentrations of the two types of thickeners, a viscosity suitable for a printing method used for manufacturing can be obtained, and also the light emission characteristics can be improved.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to color converted light emitting apparatuses of the presently disclosed subject matter with reference to the accompanying drawings in accordance with exemplary embodiments.

Figure 1:
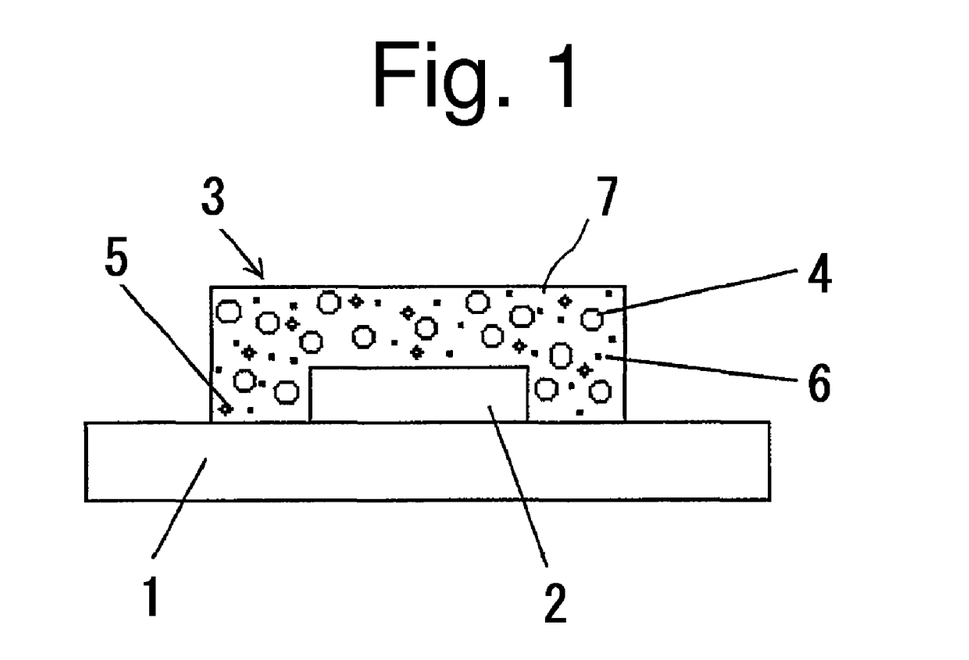
FIG. 1 is a cross-sectional view of an embodiment of a white LED apparatus made in accordance with principles of the presently disclosed subject matter.

The presently disclosed subject matter provides a color conversion semiconductor device that utilizes the light emitted from a semiconductor element as excitation light and emits light having a color converted by a phosphor or the like. In the present exemplary embodiment, a description will be given of a so-called white LED apparatus including a combination of a GaN type LED chip 2 that can emit blue light and a YAG type phosphor 4 that is excited by the blue light from the LED chip 2 and emits yellowish orange fluorescent light, as shown in FIG. 1. In the white LED apparatus, white light can be obtained by color mixing of the blue light and the yellowish orange light that are complementary to each other.

The LED chip 2 can be a flip chip. A color conversion layer 3 can be disposed so as to cover the upper and side surfaces of the LED chip 2. The color conversion layer 3 can be formed from the YAG type phosphor 4, two types of thickeners 5 and 6 for adjusting the viscosity, and a binder resin 7 containing these materials dispersed therein. The binder resin 7 can be a material transparent to blue light and fluorescent light.

In the presently disclosed subject matter, examples of the method of forming the color conversion layer 3 by a resin paste to which the thickeners have been added include printing methods such as a stencil printing method, screen printing method, and other printing methods, and a dropping method and the like. In the dropping method, for example, the color conversion layer is formed by injecting a resin paste containing a phosphor into a concave package having an LED chip mounted thereon and curing the resin paste. Such a dropping method can be used even when, for the purpose of suppressing color unevenness in the emitted light and for other purposes, a thickener is added to suppress sedimentation of the phosphor. In the present exemplary embodiment, a description will be given of an example in which the color conversion layer 3 is formed by a stencil printing method.

The combination of the LED chip 2 and the phosphor 4 is not limited to the combination of a blue LED and a YAG type phosphor, and any other combination of chip types and wavelength conversion materials may be used.

A description will now be given of a method of manufacturing the white LED apparatus in the present exemplary embodiment.

First, the blue LED chip 2 of the flip chip type can be die-bonded to a substrate 1 made of ceramic or other material. A stencil (being a metal mask, for example) having a predetermined thickness and an opening of a predetermined size can be placed on the LED chip, and stencil printing can be performed using a resin paste prepared in advance. In this manner, a resin paste coating having the same thickness as the thickness of the stencil and an upper shape the same as the shape of the opening of the stencil can be formed on the LED chip 2. Then the coating can be heated at a predetermined temperature for a predetermined time to form the color conversion layer 3.

The resin paste can be prepared as follows. First, particles having predetermined diameters are added, as thickeners for imparting thixotropy, to a thermosetting resin material. Fumed silica particles having an average primary particle diameter of 5 to 100 nm can be used as the above referenced particles. An appropriate amount of an inorganic phosphor 4 serving as a color conversion material is mixed with the above-prepared mixture. The amount of the inorganic phosphor 4 added can be adjusted according to the thickness of the color conversion layer 3 to be formed and the target chromaticity of the emitted light.

In the present exemplary embodiment, a plurality of types of thickeners (particles) with different average primary particle diameters can be used as the thickeners to be added. The inventors have found that by adjusting the average primary particle diameters of the plurality of types of thickeners and by adjusting the mixing proportion of the thickeners, not only the thixotropy during manufacturing can be adjusted, but also the light emission characteristics of the produced LED apparatus can be improved. It should be noted that in the present exemplary embodiment a first thickener with a larger diameter (denoted by 5 in FIG. 1) and a second thickener with a smaller diameter (denoted by 6 in FIG. 1) can be used in combination.

More specifically, the inventors have found that the light emission characteristics of the LED apparatus can be improved by using, as thickeners for forming the color conversion layer, a mixture of a first thickener having an average primary particle diameter of approximately 40 nm and a second thickener having a smaller average primary particle diameter than the first thickener in an appropriate ratio.

Desirably, the average primary particle diameter of the second thickener mixed with the first thickener having the average primary particle diameter of approximately 40 nm can be less than one half of the average primary particle diameter (approximately 40 nm) of the first thickener, or the difference in average primary particle diameter between the first and second thickeners can be greater than 20 nm. In particular, the value of the second thickener can be 7 nm or more and less than 20 nm.

When a mixture of two types of thickeners including the first and second thickeners having average primary particle diameters of 16 nm and 40 nm, respectively, is used, the proportion of the amount of the first thickener to the total amount of the thickeners can be set to 30 wt % or more and less than 100 wt %, alternatively 50 wt % or more and less than 100 wt %, and still alternatively 60 wt % or more and 95 wt % or less. In this manner, the desirable effect of improving the light emission efficiency can be obtained.

When the total amount of the first and second thickeners relative to the amount of the paste is set to 22.5 wt %, the effect of improving the light emission efficiency is particularly large by setting the amount of the first thickener relative to the total amount of the thickeners to 60 wt % or more and 95 wt % or less. When the total amount of the first and second thickeners is adjusted such that the paste has an appropriate viscosity, the effect of improving the light emission efficiency is particularly large by setting the amount of the first thickener relative to the total amount of the first and second thickeners to 60 wt % or more and 90 wt % or less.

When a mixture of two types of thickeners including the first thickener having the average primary particle diameter of approximately 40 nm and a third thickener having an average primary particle diameter of approximately 7 nm is used, the effect of improving the light emission characteristics can be obtained by setting the concentration of the first thickener to 90 wt % or more and less than 100 wt %.

When a mixture of two types of thickeners including the first thickener having the average primary particle diameter of approximately 40 nm and the second thickener having the average primary particle diameter of approximately 16 nm is used, the desirable effect of improving the chromaticity of the emitted light can be obtained by setting the concentration of the first thickener based on the total amount of the first and second thickeners to 50 wt % or more and alternatively 70 wt % or more and 90 wt % or less.

When a mixture of two types of thickeners including the first thickener having the average primary particle diameter of approximately 40 nm and the third thickener having the average primary particle diameter of approximately 7 nm is used, the desirable effect of improving the chromaticity of the emitted light can be obtained by setting the concentration of the first thickener based on the total amount of the first and third thickeners to 80 wt % or more and less than 100 wt %.

It should be noted that the thickeners can be obtained as commercially available products. Examples of such thickeners include, but are not limited to, Aerosil (registered trademark) OX50 (product of NIPPON AEROSIL CO., LTD., average primary particle diameter: approximately 40 nm), Aerosil (registered trademark) 130 (product of NIPPON AEROSIL CO., LTD., average primary particle diameter: approximately 16 nm), Aerosil (registered trademark) 380 (product of NIPPON AEROSIL CO., LTD., average primary particle diameter: approximately 7 nm), and the like. The average primary particle diameter is determined using electron micrographs of the product to be analyzed by measuring the diameters of 3000-5000 particles and calculating the arithmetical mean to be the average primary particle diameter. It should be noted that for the measurement of the diameter, only those primary particles where at least one half of the circumference is recognizable are considered. Examples of equipment for determining the primary particle size distribution include TGZ 3 particle size analyzer by ENDTER and GEBAUER.

The white LED apparatus according to the presently disclosed subject matter can be applied to, for example, LED headlights, LED road lights, backlighting systems, display systems, and general purpose illumination systems.

EXAMPLES

Examples 1 to 4

In each of Examples 1 to 4, the white LED apparatus shown in FIG. 1 was produced.

An LED chip 2 having a side length of 980 µm and a thickness (including the thickness of a die bonding portion) of 100 µm was used. The LED chip 2 was die-bonded to a ceramic-made substrate (package) 4 so as to be placed in position. The color conversion layer 3 was formed on the LED chip 2 by a stencil printing (metal mask printing) method.

A phosphor dispersion (paste) prepared by mixing 25 wt % of a YAG type phosphor 4 and 22.5 wt % of fumed silica with a thermosetting silicone resin 7 as a binder resin was used as a material for forming the color conversion layer. A mixture of Aerosil (registered trademark) OX50 (product of NIPPON AEROSIL CO., LTD., average primary particle diameter: approximately 40 nm) and Aerosil (registered trademark) 130 (product of NIPPON AEROSIL CO., LTD., average primary particle diameter: approximately 16 nm) was used as the fumed silica. Hereinafter, Aerosil (registered trademark) OX50 is referred to as a first thickener 5, and Aerosil (registered trademark) 130 is referred to as a second thickener 6. Of course, other thickeners can be used for first thickener 5 and second thickener 6. The addition of the first and second thickeners 5 and 6 can adjust the viscosity of the phosphor dispersion (paste) to a value suitable for stencil printing.

In Example 1, the amount of the first thickener 5 was 49.8 wt % based on the total weight of the first and second thickeners 5 and 6.

A coating of the phosphor dispersion (paste) prepared as above was formed by stencil printing using a stainless steel-made stencil (metal mask) having a thickness of 200 µm so as to cover the upper and side surfaces of the LED chip 2. After printed, the coating was heated to 150° C. for 2 hours to cure the silicone resin 7, whereby the color conversion layer 3 was formed. The thickness of the formed color conversion layer 3 is substantially a value obtained by subtracting the thickness of the LED chip 2 from the thickness of the metal mask. In the above manner, the white LED apparatus of Example 1 was produced.

In Examples 2 to 4, phosphor dispersions (pastes) were similarly prepared in which the proportions of the amount of the first thickener 5 to the total amount of the first and second thickeners 5 and 6 were 69.1, 90.0, and 96.8 wt %, respectively, as shown in Table 1. Accordingly, white LED apparatuses were produced under the same conditions as in Example 1 except for using the above phosphor dispersions.

The proportion of the total amount of the thickeners to the amount of the paste and the proportion of the first thickener 5 to the total amount of the thickeners are shown in Table 1 for each of Examples 1 to 4. The total amounts of the thickeners in Examples 1 to 4 were the same and 22.5 wt %.

TABLE 1

| | Total amount of thickeners to amount of paste (wt %) | Amount of first thickener to total amount of thickeners (wt %) |
|---|---|---|
| Example 1 | 22.5 | 49.8 |
| Example 2 | 22.5 | 69.1 |
| Example 3 | 22.5 | 90.0 |
| Example 4 | 22.5 | 96.8 |
| Comparative Example 1 | 22.5 | 0 |
| Comparative Example 2 | 22.5 | 21.1 |
| Comparative Example 3 | 22.5 | 100 |

Comparative Examples 1 to 3

In each of Comparative Examples 1 to 3, a white LED apparatus was produced using a paste in which the total amount of the thickeners was 22.5 wt % (the same as those in Examples 1 to 4) and the proportion of the amount of the first thickener 5 to the total amount of the thickeners was changed to 0, 21.1, or 100%, as shown in Table 1. The other conditions were the same as those in Examples 1 to 4.

Examples 5 to 8

In Examples 1 to 4 and Comparative Examples 1 to 3, the total amounts of the thickeners were the same (22.5 wt %), but the proportions of the first thickener 5 were changed. Since the strengths of the viscosity increasing effects of the first thickener 5 and the second thickener 6 on a paste are different, the viscosities of the pastes in Examples 1 to 4 and Comparative Examples 1 to 3 were different.

Generally, large fumed silica particles have a small specific surface area and exhibit a weaker viscosity increasing effect than small fumed silica particles. Therefore, the viscosity of the paste decreases as the proportion of the amount of the first thickener 5 having a larger average primary particle diameter increases. With a low viscosity paste, sagging, protrusions caused by a stencil releasing failure, and other defects are likely to occur in the color conversion layer 3. In contrast, the viscosity of the paste increases as the proportion of the second thickener 6 having a smaller average primary particle diameter increases. In some cases, the viscosity can increase to the extent that kneading cannot be performed in practice. Therefore, when a mixture of two different thickeners is used in an actual process, the total amount of the thickeners that provides an optimal paste viscosity suitable for printing can be determined according to the mixing proportion of the two thickeners.

In Examples 5 to 8, the total amount of the thickeners that provided an optimal paste viscosity suitable for printing was determined for each mixing proportion of the two thickeners, and the color conversion layers 3 were formed after the viscosities were adjusted to suitable values.

More specifically, in Examples 5 to 8, the proportions of the amount of the first thickener 5 to the total amount of the thickeners were set to 45.5, 67.5, 87.7, and 97.9 wt %, and the total amounts of the thickeners were set to 18.6, 27.3, 33.9, and 35.8 wt %, respectively, to obtain suitable viscosities. These conditions are summarized in Table 2.

The white LED apparatuses of Examples 5 to 8 were produced under the same conditions as those in Example 1 except for the above conditions being changed.

TABLE 2

| | Total amount of thickeners to amount of paste (wt %) | Amount of first thickener to total amount of thickeners (wt %) |
|---|---|---|
| Example 5 | 18.6 | 45.5 |
| Example 6 | 27.3 | 67.5 |
| Example 7 | 33.9 | 87.7 |
| Example 8 | 35.8 | 97.9 |
| Comparative Example 4 | 13.3 | 0 |
| Comparative Example 5 | 15.6 | 22.3 |
| Comparative Example 6 | 33.9 | 100 |

Comparative Examples 4 to 6

In Comparative Examples 4 to 6, as in Examples 5 to 8, the proportions of the amount of the first thickener 5 to the total amount of the thickeners were set to 0, 22.3, and 100 wt %, and the total amounts of the thickeners were set to 13.3, 15.6, and 33.9 wt %, respectively, to obtain suitable paste viscosities. The white LED apparatuses of Comparative Examples 4 to 6 were produced under the same conditions as those in Example 1 except for the above conditions being changed.

Examples 9 and 10

In Examples 9 and 10, fumed silica particles having a smaller diameter (for example Aerosil (registered trademark) 380, having an average primary particle diameter: approximately 7 nm, hereinafter referred to as a third thickener) were used instead of the second thickener 6, and white LED apparatuses were produced in the same manner as in Examples 5 to 8.

As in Examples 5 to 8, the proportions of the amount of the first thickener 5 to the total amount of the first and third thickeners were set to 90.0 and 97.9 wt %, respectively, and the total amounts of the thickeners were set to 28.2 and 32.6 wt %, respectively, to obtain suitable paste viscosities. The total amount of the thickeners and the proportion of the first thickener 5 are shown in Table 3 for each of Examples 9 and 10.

White LED apparatuses were produced in the same manner as in Example 1 except for the compositions of the pastes.

TABLE 3

| | Total amount of thickeners to amount of paste (wt %) | Amount of first thickener to total amount of thickeners (wt %) |
|---|---|---|
| Example 9 | 28.2 | 90.0 |
| Example 10 | 32.6 | 97.9 |
| Comparative Example 7 | 11.3 | 0 |
| Comparative Example 8 | 13.2 | 22.1 |
| Comparative Example 9 | 21.1 | 70.1 |

Comparative Examples 7 to 9

In Comparative Examples 7 to 9, as in Examples 9 and 10, the thickener (C) was used instead of the second thickener. Moreover, the ratios of the first thickener were set to 0, 22.1, and 70.1 wt %, and the total amounts of the thickeners were set to 11.3, 13.2, and 21.1 wt %, respectively, to obtain suitable paste viscosities. The white LED apparatuses of Comparative Examples 7 to 9 were produced under the same conditions as those in Example 1 except for the above conditions being changed.

Comparative Examples 10 to 13

Fumed silica particles having a larger average primary particle diameter (Aerosil (registered trademark) 90G, having an average primary particle diameter: approximately 20 nm, hereinafter referred to as a comparative thickener) were used instead of the second thickener, and white LED apparatuses were produced in the same manner as in Examples 1 to 4.

In Comparative Examples 10 to 13, as in Examples 1 to 4, the total amounts of the thickeners were the same (22.5 wt %), and the proportions of the amount of the first thickener 5 to the total amount of the thickeners (including the comparative thickener and the first thickener) were set to 0, 22.1, 50.5, and 70.1 wt %. The total amount of the thickeners and the proportion of the first thickener are shown in Table 4 for each of Comparative Examples 10 to 13.

TABLE 4

|  | Total amount of thickeners to amount of paste (wt %) | Amount of first thickener to total amount of thickeners (wt %) |
| --- | --- | --- |
| Comparative Example 10 | 22.5 | 0 |
| Comparative Example 11 | 22.5 | 22.1 |
| Comparative Example 12 | 22.5 | 50.5 |
| Comparative Example 13 | 22.5 | 70.1 |

<Evaluation>

The luminous flux and chromaticity of the white LED apparatus of each of Examples and Comparative Examples were measured. More specifically, the total luminous flux was measured for the white LED apparatus of each of Examples and Comparative Examples in which the color conversion layer 3 was provided, and the light emission efficiency was determined by dividing the measured value by the total luminous flux of a specimen not including the color conversion layer 3. FIGS. 2 to 5 show the relationship between the light emission efficiency and the proportion of the first thickener, and FIGS. 6 to 9 show the relationship between the chromaticity and the proportion of the first thickener (Light Emission Efficiency)

Figure 2:
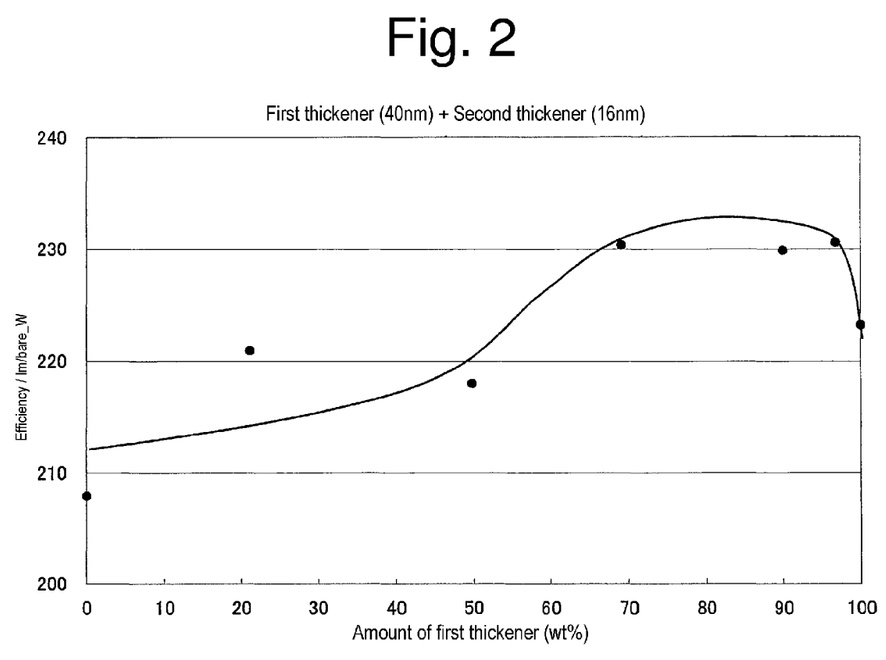
FIG. 2 is a graph showing the relationship between the amount of a first thickener and the light emission efficiency for the white LED apparatuses of Examples 1 to 4 and Comparative Examples 1 to 3.
Figure 3:
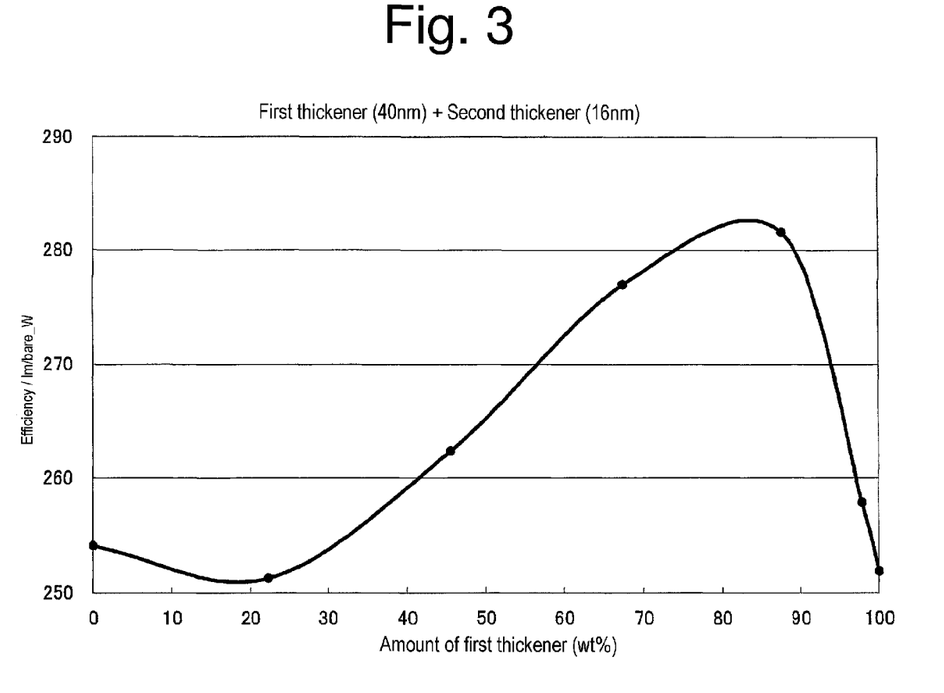
FIG. 3 is a graph showing the relationship between the amount of the first thickener and the light emission efficiency for the white LED apparatuses of Examples 5 to 8 and Comparative Examples 4 to 6.

FIG. 2 shows the relationship between the light emission efficiency and the proportion of the amount of the first thickener to the total amount of the thickeners for the white LED apparatuses of Examples 1 to 4 and Comparative Examples 1 to 3. FIG. 3 shows the relationship between the light emission efficiency and the proportion of the amount of the first thickener to the total amount of the thickeners for the white LED apparatuses of Examples 5 to 8 and Comparative Examples 4 to 6.

In Examples 1 to 4 and Comparative Examples 1 to 3, the total amounts of the thickeners relative to the amounts of the pastes were the same, and the mixing proportion of the first thickener 5 and the second thickener 6 was changed. As can be seen from FIG. 2, when the amount of the first thickener 5 added was small, the light emission efficiency was substantially the same as that of the white light LED apparatus in which only the second thickener was used. When the concentration of the first thickener 5 exceeded 50 wt %, the light emission efficiency increased. When the concentration of the first thickener 5 was 70 wt % or more and 95 wt % or less, the light emission efficiency exhibited a maximum value.

In Examples 5 to 8 and Comparative Examples 4 to 6, the mixing proportion of the first and second thickeners 5 and 6 having average primary particle diameters of approximately 40 nm and approximately 16 nm, respectively, was changed while the viscosity of the paste was held substantially constant. As can be seen from FIG. 3, the effect of mixing two thickeners was more prominent. More specifically, the light emission efficiency increased when the concentration of the first thickener 5 exceeded 30 wt % and exhibited a maximum at about 80 wt %. When the concentration of the first thickener 5 was 60 wt % or more and 90 wt % or less, the light emission efficiency was improved by about 10% as compared to the light emission efficiency when only the second thickener was used (the amount of the first thickener was 0 wt %).

Figure 4:
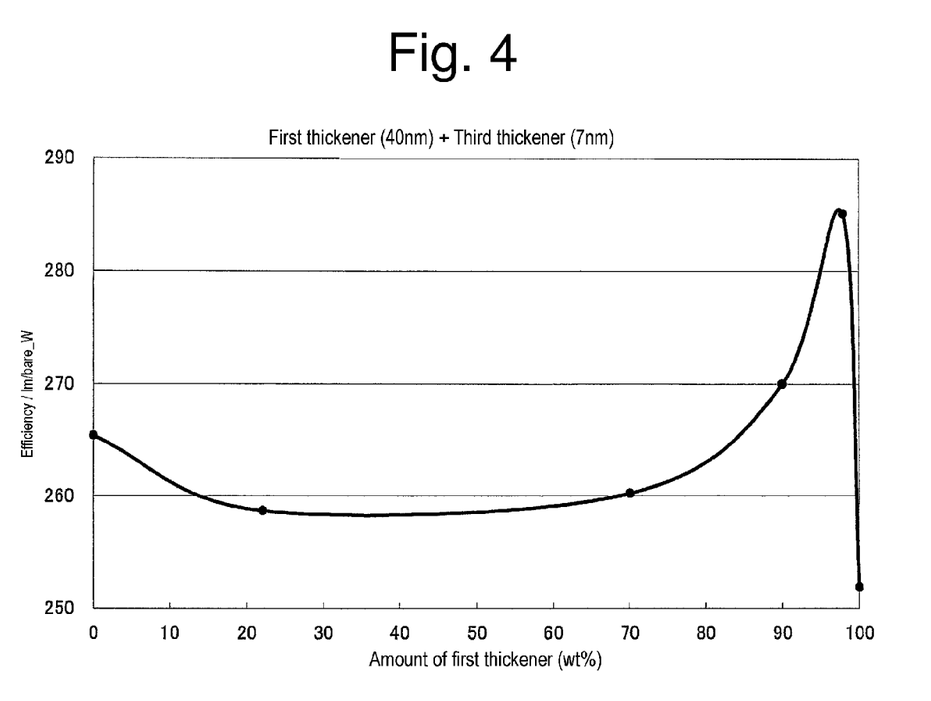
FIG. 4 is a graph showing the relationship between the amount of the first thickener and the light emission efficiency for the white LED apparatuses of Examples 9 and 10 and Comparative Examples 7 to 9.
Figure 5:
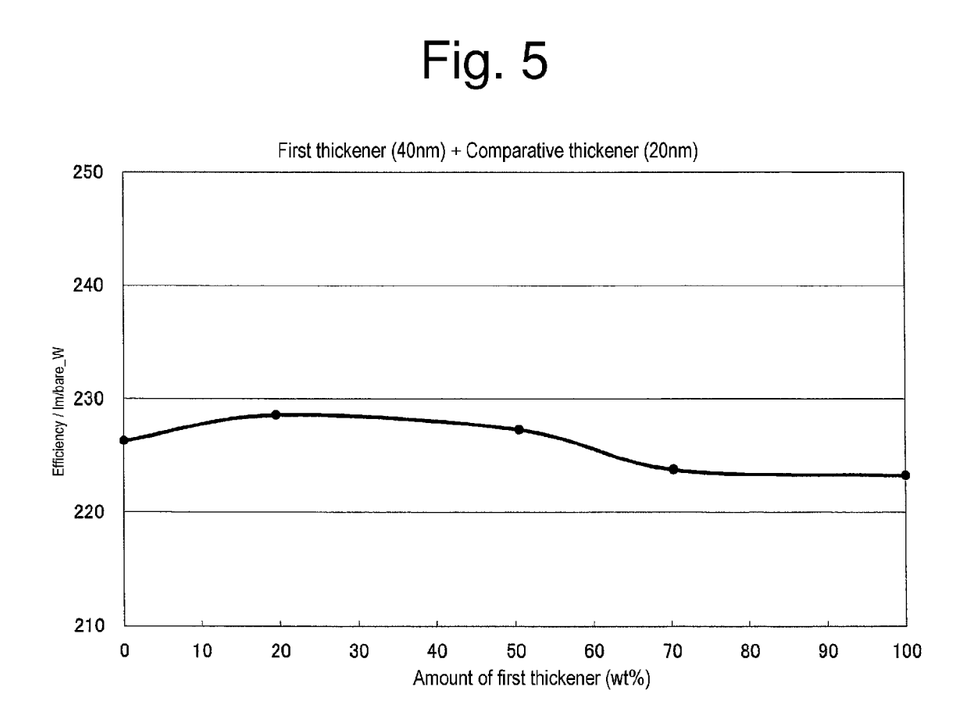
FIG. 5 is a graph showing the relationship between the amount of the first thickener and the light emission efficiency for the white LED apparatuses of Comparative Examples 10 to 13.

FIG. 4 shows the relationship between the light emission efficiency and the proportion of the amount of the first thickener to the total amount of the thickeners for the white LED apparatuses of Examples 9 and 10 and Comparative Examples 7 to 9. FIG. 5 shows the relationship between the light emission efficiency and the proportion of the amount of the first thickener to the total amount of the thickeners for the white LED apparatuses of Comparative Examples 10 to 13.

As can be seen from FIG. 4, even when the third thickener having the average primary particle diameter of approximately 7 nm was used instead of the second thickener having the average primary particle diameter of approximately 16 nm, the light emission efficiency could be improved by the mixture of two thickeners in Examples 9 and 10. This effect was obtained when the concentration of the first thickener was high (90 wt % or more and less than 100 wt %), and this range was narrower than that in FIG. 2.

As can be seen from FIG. 5, when the comparative thickener having the average primary particle diameter of approximately 20 nm was used instead of the second thickener 6, almost no efficiency improving effect of the mixture of the thickeners was observed.

Therefore, it was found that, when a mixture of the two types of the first and second thickeners having respective average primary particle diameters of approximately 40 nm and approximately 16 nm is used, the effect of improving the light emission efficiency can be obtained by setting the concentration of the first thickener relative to the total amount of the first and second thickeners to 30 wt % or more and less than 100% and alternatively 50 wt % or more and less than 100 wt %. When the total amount of the thickeners relative to the amount of the paste is set to 22.5 wt %, it is desirable to set the proportion of the amount of the first thickener to the total amount of the thickeners to 70 wt % or more and 95 wt % or less because the effect of improving the light emission efficiency is particularly large. When the total amount of the thickeners is adjusted such that the paste has an appropriate viscosity, it is desirable to set the amount of the first thickener relative to the total amount of the thickeners to 60 wt % or more and 90 wt % or less because the effect of improving the light emission efficiency is particularly large.

When a mixture of the two thickeners including the first thickener and the third thickener having respective average primary particle diameters of approximately 40 nm and approximately 7 nm is used while the viscosity of the paste is held constant, the effect of improving the light emission efficiency can be obtained by setting the concentration of the first thickener to 90 wt % or more and less than 100 wt %.

When a mixture of the first thickener having the average primary particle diameter of approximately 40 nm and the comparative thickener having the average primary particle diameter of approximately 20 nm is used, the effect of improving the light emission efficiency is not obtained. Therefore, desirably, the thickener mixed with the first thickener has an average primary particle diameter less than one half of the average primary particle diameter (approximately 40 nm) of the first thickener, or the difference in average primary particle diameter between the first thickener and the thickener mixed with the first thickener is greater than 20 nm.

(Emission Chromaticity)

Figure 6:
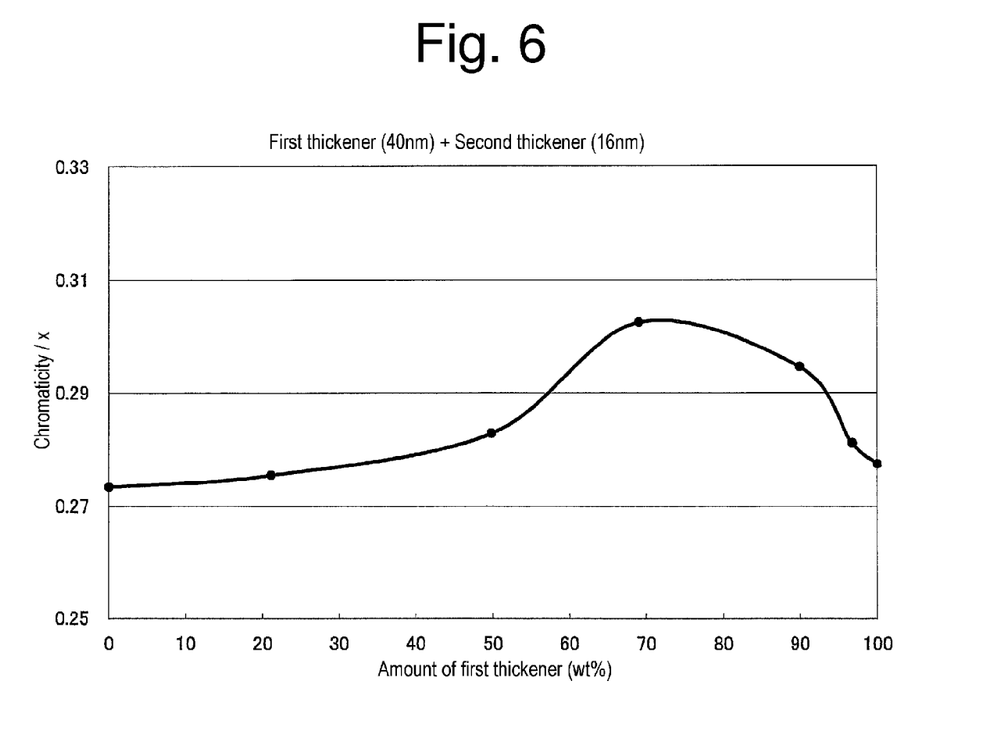
FIG. 6 is a graph showing the relationship between the amount of the first thickener and the emission chromaticity for the white LED apparatuses of Examples 1 to 4 and Comparative Examples 1 to 3.
Figure 7:
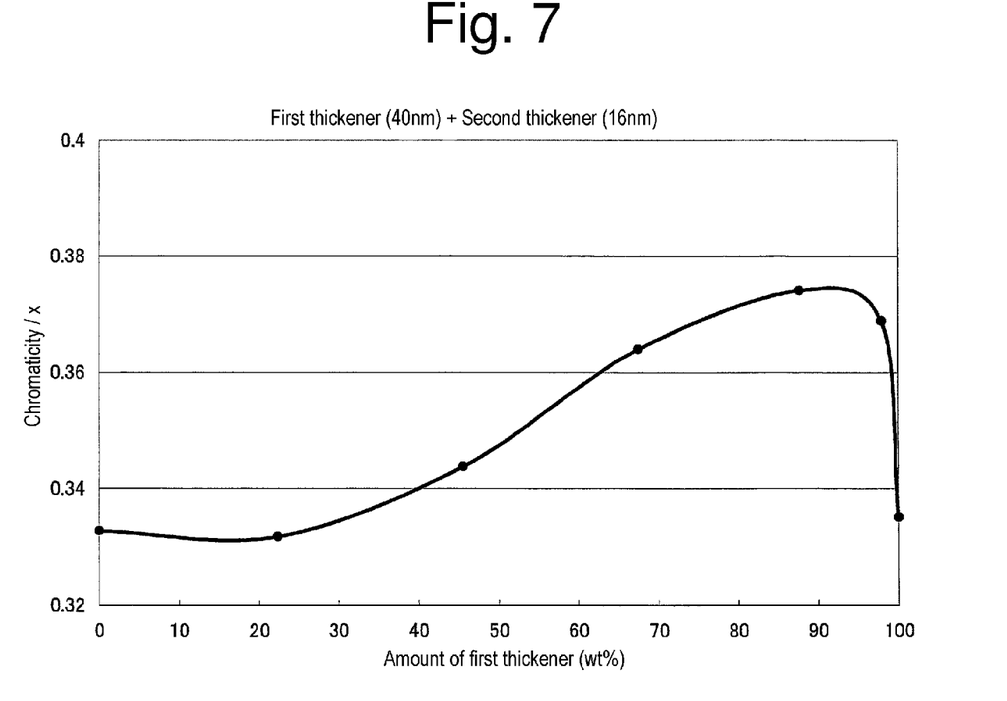
FIG. 7 is a graph showing the relationship between the amount of the first thickener and the emission chromaticity for the white LED apparatuses of Examples 5 to 8 and Comparative Examples 4 to 6.

FIG. 6 shows the relationship between the emission chromaticity and the proportion of the amount of the first thickener to the total amount of the thickeners for the white LED apparatuses of Examples 1 to 4 and Comparative Examples 1 to 3. FIG. 7 shows the relationship between the emission chromaticity and the proportion of the amount of the first thickener to the total amount of the thickeners for the white LED apparatuses of Examples 5 to 8 and Comparative Examples 4 to 6.

In Examples 1 to 4 and Comparative Examples 1 to 3, the total amounts of the thickeners relative to the amounts of the pastes were the same, and the mixing proportion of the first and second thickeners 5 and 6 was changed. As can be seen from FIG. 6, when the amount of the first thickener 5 added was small, the chromaticity was substantially the same as that in the case where only one type of the thickener was used. When the concentration of the first thickener 5 relative to the total amount of the thickeners exceeded 50 wt %, the chromaticity was high. The chromaticity exhibited a maximum when the concentration of the first thickener 5 was 70 wt % or more and 90 wt % or less.

In Examples 5 to 8 and Comparative Examples 4 to 6, the mixing proportion of the first and second thickeners 5 and 6 having respective average primary particle diameters of approximately 40 nm and approximately 16 nm, respectively, was changed while the viscosity of the paste was held substantially constant. As can be seen from FIG. 7, the effect of mixing the thickeners similar to than in the above results was obtained.

Figure 8:
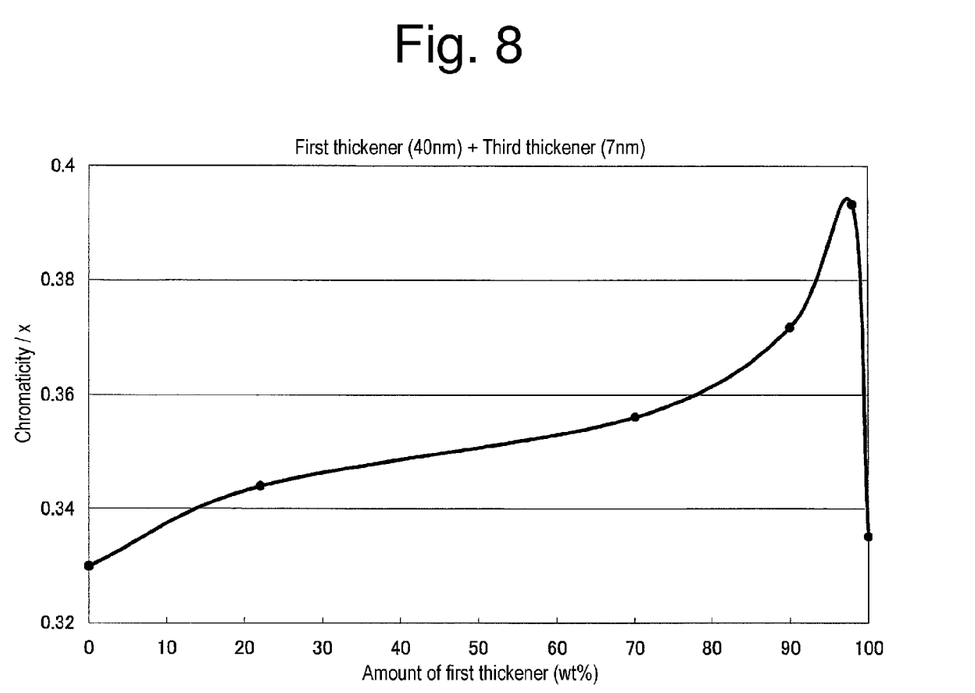
FIG. 8 is a graph showing the relationship between the amount of the first thickener and the emission chromaticity for the white LED apparatuses of Examples 9 and 10 and Comparative Examples 7 to 9.
Figure 9:
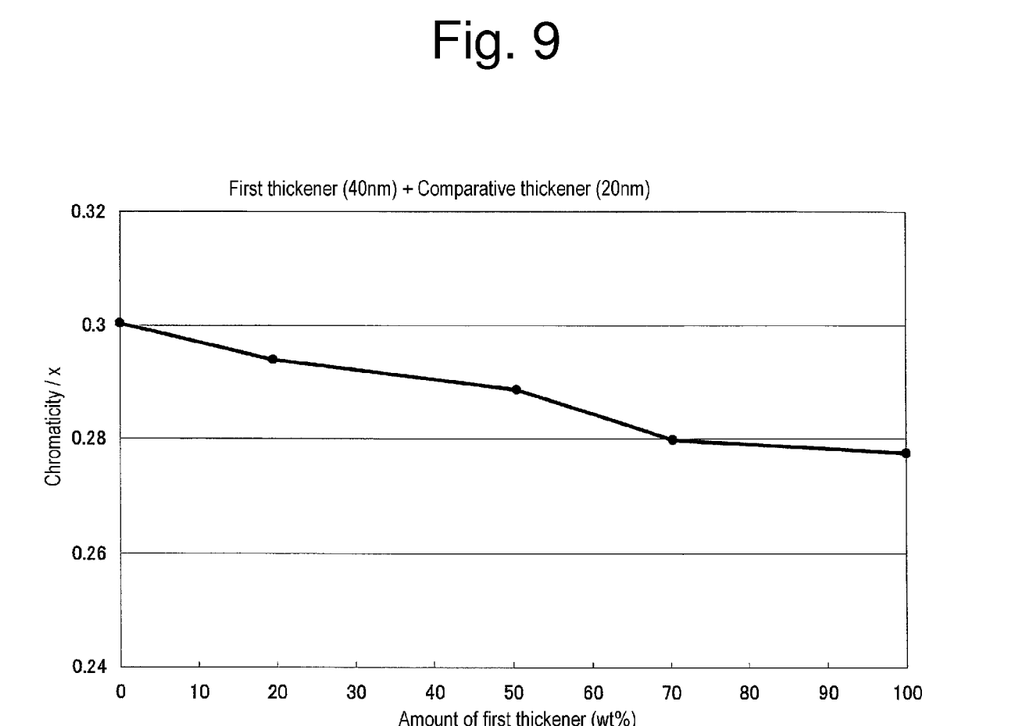
FIG. 9 is a graph showing the relationship between the amount of the first thickener and the emission chromaticity for the white LED apparatuses of Comparative Examples 10 to 13.

FIG. 8 shows the relationship between the emission chromaticity and the proportion of the first thickener to the total amount of the thickeners for the white LED apparatuses of Examples 9 and 10 and Comparative Examples 7 to 9. FIG. 9 shows the relationship between the emission chromaticity and the proportion of the first thickener to the total amount of the thickeners for the white LED apparatuses of Comparative Examples 10 to 13.

As can be seen from FIG. 8, even when the third thickener having a small average primary particle diameter (approximately 7 nm) was used instead of the second thickener having the average primary particle diameter of approximately 16 nm, the chromaticity improving effect of the mixture of two thickeners was obtained in Examples 9 and 10. In this case, when the amount of the first thickener 5 added was small, the chromaticity increased gradually. In particular, when the concentration of the first thickener 5 was high (80 wt % or more), the effect was prominent, as shown in FIG. 8.

As can be seen from FIG. 9, when the comparative thickener having a large average primary particle diameter (approximately 20 nm) was used instead of the second thickener 6, almost no chromaticity improving effect of the mixture of two thickeners was observed. Therefore, in the presently disclosed subject matter, it was found that, when a mixture of the two types of the first and second thickeners having respective average primary particle diameters of approximately 40 nm and approximately 16 nm is used, the effect of improving emission chromaticity can be obtained by setting the concentration of the first thickener relative to the total amount of the first and second thickeners to 50 wt % or more and alternatively 70 wt % or more and 90 wt % or less, as shown in FIGS. 6 and 7. This range is unchanged when the amount of the thickeners relative to the amount of the paste is held constant (22.5 wt %) and when the total amount of the thickeners is adjusted such that the viscosity of the paste is adjusted to a suitable value.

It was also found that, when a mixture of the two types of the first and third thickeners having respective average primary particle diameters of approximately 40 nm and approximately 7 nm is used and the viscosity of the paste is adjusted to be constant, the effect of improving the emission chromaticity can be obtained by setting the concentration of the first thickener to 80 wt % or more and less than 100 wt %.

When a mixture of the first thickener having the average primary particle diameter of approximately 40 nm and the comparative thickener having the average primary particle diameter of approximately 20 nm was used, the effect of improving the emission chromaticity was not obtained. Therefore, desirably, the thickener mixed with the first thickener has a particle diameter less than one half of the average primary particle diameter (approximately 40 nm) of the first thickener, or the difference in average primary particle diameter between the first thickener and the thickener mixed with the first thickener is greater than 20 nm.

The above results show that the light emission efficiency of the LED apparatus can be improved when a mixture of the first thickener 5 having the average primary particle diameter of approximately 40 nm and a thickener having a smaller average primary particle diameter in an appropriate mixing proportion is used as thickeners for forming the color conversion layer.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A color converted light emitting apparatus comprising:
a light emitting element; and
a color conversion layer including, a phosphor that is configured to be excited by light emitted from the light emitting element and to thus emit fluorescent light, and particles of a first thickener having an average primary particle diameter and particles of a second thickener having an average primary particle diameter, with the average primary particle diameter of the first thickener being different from the average primary particle diameter of the second thickener, and wherein the average primary particle diameter of the second thickener is less than one half of the average primary particle diameter of the first thickener and wherein the first thickener is present in an amount greater than or equal to 30 wt % and less than 100 wt % based on a total weight of the first and second thickeners.

2. The color converted light emitting apparatus according to claim 1, wherein a difference in average primary particle diameter between the first and second thickeners is greater than 20 nm.

3. The color converted light emitting apparatus according to claim 1, wherein the average primary particle diameter of the first thickener is approximately 40 nm.

4. The color converted light emitting apparatus according to claim 2, wherein the average primary particle diameter of the first thickener is approximately 40 nm.

5. The color converted light emitting apparatus according to claim 1, wherein the average primary particle diameter of the second thickener is greater than or equal to 7 nm and less than 20 nm.

6. The color converted light emitting apparatus according to according to claim 2, wherein the average primary particle diameter of the second thickener is greater than or equal to 7 nm and less than 20 nm.

7. The color converted light emitting apparatus according to according to claim 3, wherein the average primary particle diameter of the second thickener is greater than or equal to 7 nm and less than 20 nm.

8. The color converted light emitting apparatus according to according to claim 4, wherein the average primary particle diameter of the second thickener is greater than or equal to 7 nm and less than 20 nm.

9. The color converted light emitting apparatus according to claim 5, wherein the average primary particle diameter of the second thickener is approximately 7 nm.

10. The color converted light emitting apparatus according to claim 6, wherein the average primary particle diameter of the second thickener is approximately 7 nm.

11. The color converted light emitting apparatus according to claim 7, wherein the average primary particle diameter of the second thickener is approximately 7 nm.

12. The color converted light emitting apparatus according to claim 8, wherein the average primary particle diameter of the second thickener is approximately 7 nm.

13. The color converted light emitting apparatus according to claim 5, wherein the average primary particle diameter of the second thickener is approximately 16 nm.

14. The color converted light emitting apparatus according to claim 6, wherein the average primary particle diameter of the second thickener is approximately 16 nm.

15. The color converted light emitting apparatus according to claim 7, wherein the average primary particle diameter of the second thickener is approximately 16 nm.

16. The color converted light emitting apparatus according to claim 8, wherein the average primary particle diameter of the second thickener is approximately 16 nm.

17. The color converted light emitting apparatus according to claim 1, wherein the average primary particle diameter of the second thickener is approximately 16 nm, and the first thickener is present in an amount greater than or equal to 60 wt % and less than or equal to 95 wt %, based on total weight of the first and second thickeners.

18. The color converted light emitting apparatus according to claim 1, wherein the average primary particle diameter of the second thickener is approximately 7 nm, and the first thickener is present in an amount greater than or equal to 90 wt % and less than 100 wt % based on total weight of the first and second thickeners.

19. The color converted light emitting apparatus according to claim 1, wherein the average primary particle diameter of the second thickener is approximately 7 nm, and the first thickener is present in an amount greater or equal to 70 wt % and less than or equal to 90 wt % based on total weight of the first and second thickeners.

20. The color converted light emitting apparatus according to claim 1, wherein the average primary particle diameter of the second thickener is approximately 16 nm, and the first thickener is present in an amount greater than or equal to 70 wt % and less than or equal to 90 wt % based on total weight of the first and second thickeners.

* * * * *